(12) United States Patent
Chen (10) Patent No.: US 7,323,675 B2
(45) Date of Patent: Jan. 29, 2008

(54) PACKAGING STRUCTURE OF A LIGHT-SENSING DEVICE WITH A SPACER WALL

(75) Inventor: Po-Hung Chen, Shin-Chu (TW)

(73) Assignee: Sigurd Microelectronics Corp., Shin-Chu (TW)

( * ) Notice: Subject to any disclaimer, the term of this patent is extended or adjusted under 35 U.S.C. 154(b) by 135 days.

(21) Appl. No.: 11/230,506

(22) Filed: Sep. 21, 2005

(65) Prior Publication Data
US 2007/0063129 A1    Mar. 22, 2007

(51) Int. Cl.
*H01L 31/00* (2006.01)
(52) U.S. Cl. ............ 250/214.1; 250/239; 257/432
(58) Field of Classification Search ............ 250/239, 250/214.1, 208.1; 257/432–434; 348/340; 438/403, 424
See application file for complete search history.

(56) References Cited

U.S. PATENT DOCUMENTS

| | | | |
|---|---|---|---|
| 4,626,478 A * | 12/1986 | van Dyk Soerewyn | 428/596 |
| 5,120,678 A * | 6/1992 | Moore et al. | 29/840 |
| 5,530,278 A * | 6/1996 | Jedicka et al. | 257/432 |
| 5,861,678 A * | 1/1999 | Schrock | 257/783 |
| 6,400,007 B1 * | 6/2002 | Wu et al. | 257/686 |
| 6,759,307 B1 * | 7/2004 | Yang | 438/455 |
| 6,885,107 B2 * | 4/2005 | Kinsman | 257/778 |
| 7,061,124 B2 * | 6/2006 | Tan et al. | 257/782 |
| 7,078,264 B2 * | 7/2006 | Yang | 438/108 |
| 2002/0130391 A1 * | 9/2002 | Yeh et al. | 257/613 |
| 2004/0149898 A1 * | 8/2004 | Hsieh et al. | 250/239 |

* cited by examiner

*Primary Examiner*—John R. Lee
(74) *Attorney, Agent, or Firm*—Rosenberg, Klein & Lee (57) ABSTRACT

The present invention discloses a packaging structure of a light-sensing device with a spacer wall, wherein a spacer wall is used to protect the light-sensing region from external pollutants or two spacer walls are used to confine the glue to therebetween lest the overflow glue pollute the light-sensing region as in the conventional technology. Further, the present invention can reduce the packaging area and can promote the yield and quality obviously.

17 Claims, 7 Drawing Sheets

PACKAGING STRUCTURE OF A LIGHT-SENSING DEVICE WITH A SPACER WALL

BACKGROUND OF THE INVENTION

1. Field of the Invention

The present invention relates to a packaging structure of a light-sensing device, particularly to a packaging structure of a light-sensing device with a spacer wall.

2. Description of the Related Art

With the wide popularity of audio/video multimedia, the digitization of images is a consequential trend, and the appearance of digital cameras, digital video cameras and image scanners signifies the arrival of the image-digitization age. CMOS (Complementary Metal Oxide Semiconductor) is a key technology for image digitization, and the quality, yield and cost thereof are critical factories in the campaign of image digitization.

Figure 1:
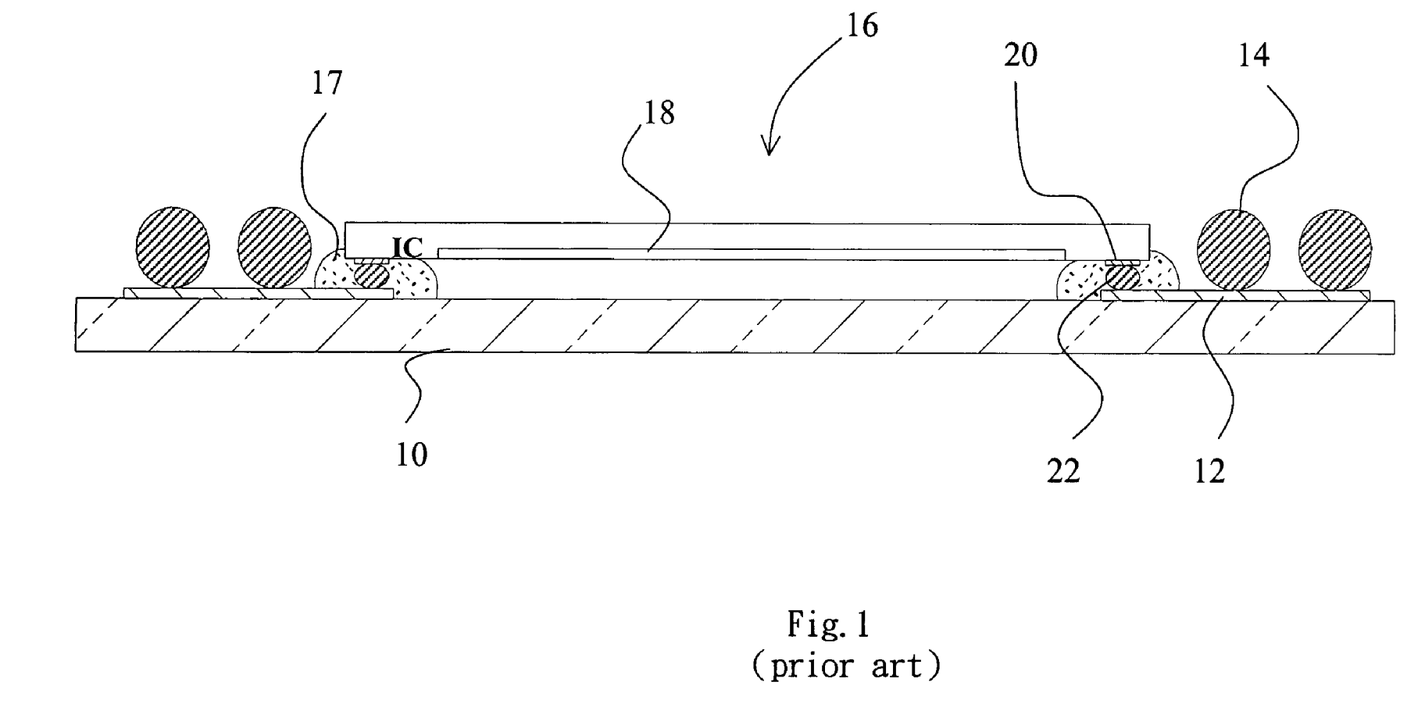
FIG. 1 is a diagram schematically showing a conventional packaging structure of a CMOS image sensor.

Refer to FIG. 1 a diagram schematically showing a conventional packaging structure of a CMOS image sensor. The conventional packaging structure comprises: a light transparent substrate 10, which has multiple metallic traces 12 and multiple metallic balls 14 used to form the electric connection with the metallic traces 12; a light-sensing element 16, having a light-sensing region 18 and multiple metallic pads 20, wherein the light-sensing element 16 is installed to the substrate 10 via multiple metallic contacts 22 and those metallic contacts 22 are also used to electrically interconnect the light-sensing element 16 and the metallic traces 12 of the substrate 10; and a glue layer 17, disposed between the substrate 10 and the light-sensing element 16, used to seal the gap between the substrate 10 and the light-sensing element 16 and used to protect the light-sensing region from external pollutants.

However, when the glue is applied to the abovementioned packaging structure, owing to the fluidity of the glue, the glue will overflow into the neighboring regions and incurs some problems. For example, when the metallic pads 20 are disposed too much close to the light-sensing region 18, the glue will overflow into the light-sensing region 18, which will influence the function of the light-sensing element 16; when the metallic pads 20 are disposed too much close to the metallic balls 14, the metallic balls 14 will be polluted by the overflow glue. When those metallic balls are processed with an SMT (Surface Mount Technology) infrared reflow, the yield loss will occur. As it is a current trend to fabricate slim and lightweight multimedia products, the spacing between the metallic pad 20 and the metallic ball 14 becomes more and more small; thus, the pollution problem becomes further serious, and the yield and quality is obviously influenced.

Accordingly, the present invention proposes a packaging structure of a light-sensing device with a spacer wall to overcome the abovementioned problems and promote the competitiveness.

SUMMARY OF THE INVENTION

The primary objective of the present invention is to provide a packaging structure of a light-sensing device with a spacer wall, which can effectively protect the light-sensing region from external pollutants.

Another objective of the present invention is to provide a packaging structure of a light-sensing device with a spacer wall, which can effectively protect the light-sensing region and the metallic balls from the pollution of the overflow glue.

Further objective of the present invention is to provide a packaging structure of a light-sensing device with a spacer wall, which can effectively promote the yield of the fabrication process so that the fabrication cost can be reduced and the market competitiveness can be enhanced.

Further another objective of the present invention is to provide a packaging structure of a light-sensing device with a spacer wall, which can realize the area reduction of the packaging structure.

To achieve the abovementioned objectives, the present invention proposes a packaging structure of a light-sensing device with a spacer wall, which comprises: a light transparent substrate, which has metallic traces on its surface; a light-sensing element, which further comprises: a light-sensing region, multiple metallic pads, and multiple metallic contacts that are disposed on the metallic pads and used to form electric connection between the metallic pads and the metallic traces; and a first spacer wall, which is disposed between the light-sensing element and the metallic pads.

The present invention further proposes another packaging structure of a light-sensing device with a spacer wall, which comprises: a light transparent substrate, which has metallic traces on its surface; a light-sensing element, which further comprises: a light-sensing region, multiple metallic pads, and multiple metallic contacts that are disposed on the metallic pads and used to form electric connection between the metallic pads and the metallic traces; a first spacer wall, which is disposed between the light-sensing element and the metallic pads; and a glue layer, which is disposed between the light transparent substrate and the light-sensing element, and used to seal the gap between the light transparent substrate and the light-sensing element.

To enable the objectives, characteristics, and accomplishments of the present invention to be more easily understood, the embodiments of the present invention is to be described below in detail in cooperation with the attached drawings.

DETAILED DESCRIPTION OF THE INVENTION

The present invention discloses a packaging structure of a light-sensing device with a spacer wall, wherein a spacer is used to protect the light-sensing region from external pollutants and used to protect the regions where the electric contacts are to be formed from the overflow glue.

Figure 2:
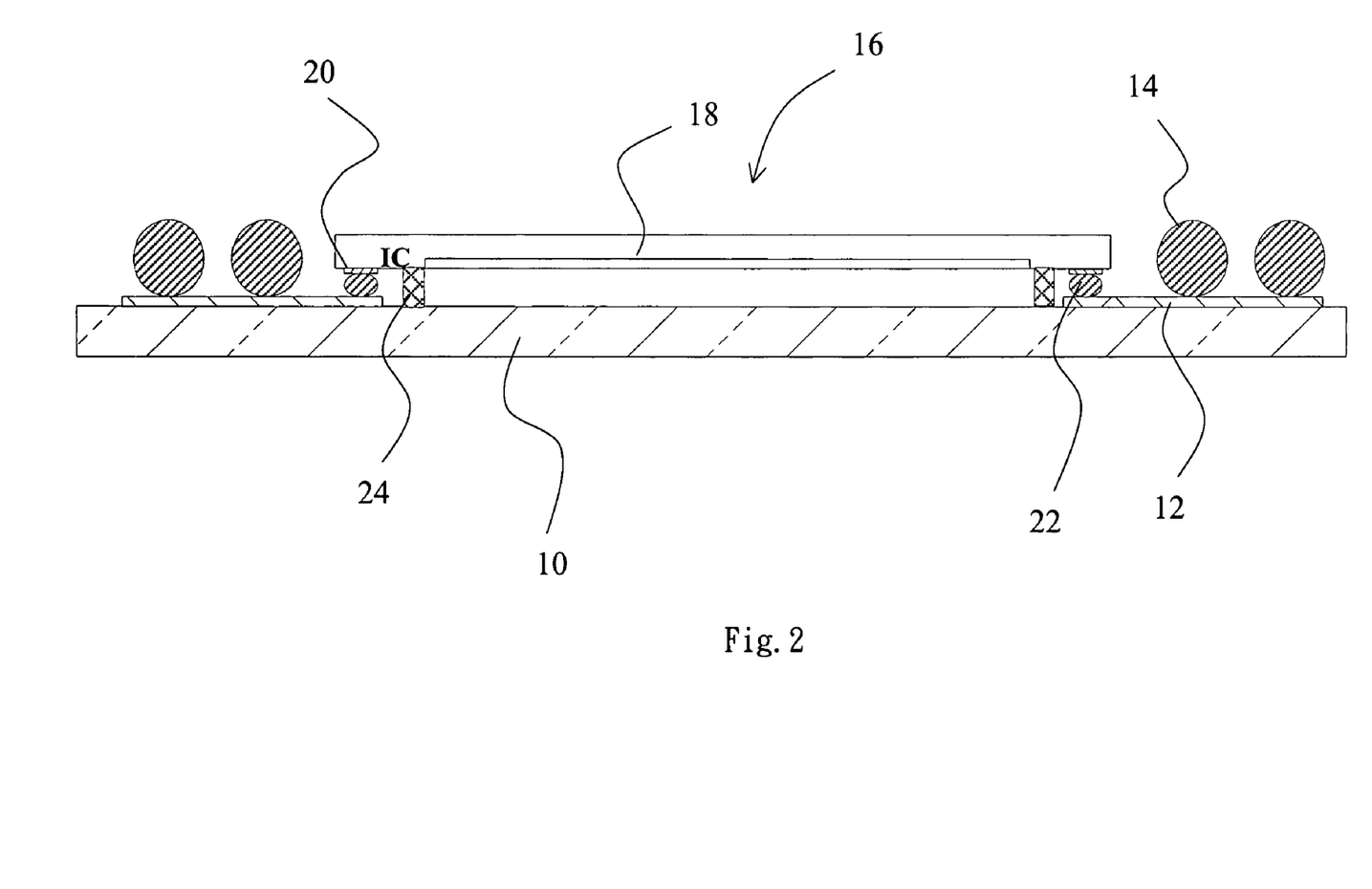
FIG. 2 is a diagram schematically showing one embodiment of the present invention.

Refer to FIG. 2 a diagram schematically showing one embodiment of the present invention. The packaging structure of a light-sensing device with a spacer wall according to one embodiment of the present invention comprises: a light transparent substrate 10, which may filter out a light of a specific wavelength; metallic traces 12, installed on the light transparent substrate 10; multiple metallic balls 14, disposed on the metallic traces 12; a light-sensing element 16, further comprising a light-sensing region 18 and multiple metallic pads 20, wherein the metallic pads 20 have multiple metallic contacts 22 for the electric connection between the metallic pads 20 and the metallic traces 12; and a spacer wall 24, disposed between the metallic pads 20 and the light-sensing region 18, and used to protect the light-sensing region 18 from external pollutants, wherein the spacer wall 24 may be formed via a screen-printing method and can be made of an insulation polymer with slight elasticity, such as a polyimide. In this embodiment, the height of the spacer wall 24 is controlled to be slightly larger than the spacing between the light transparent substrate 10 and the light-sensing element 16 and used to protect the light-sensing region 18 from external pollutants. In this embodiment, the objective of retarding external pollutants can be achieved without any additional glue layer. Therefore, the problem of the overflow glue, which occurs in the conventional technology, can be avoided herein.

Figure 3:
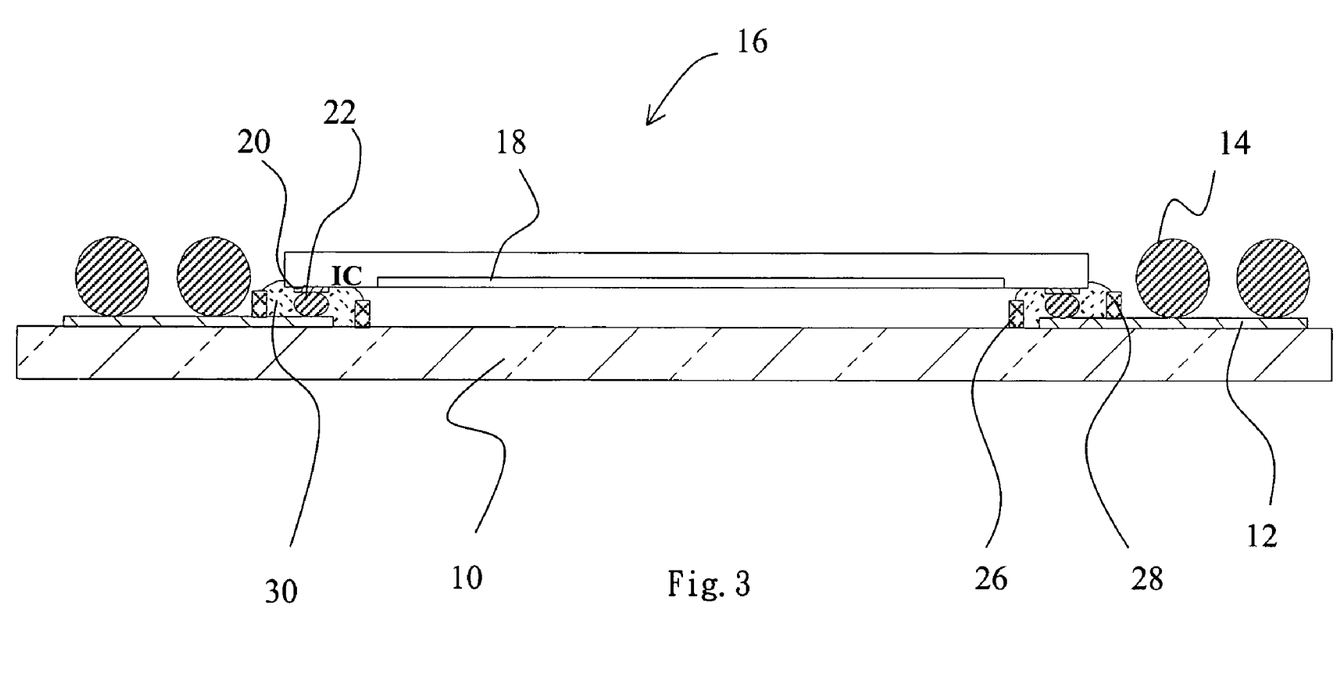
FIG. 3 is a diagram schematically showing another embodiment of the present invention.

Refer to FIG. 3 a diagram schematically showing another embodiment of the present invention. The packaging structure of a light-sensing device with a spacer wall according to another embodiment of the present invention comprises: a light transparent substrate 10; metallic traces 12, installed on the light transparent substrate 10; multiple metallic balls 14, disposed on the metallic traces 12; a light-sensing element 16, further comprising a light-sensing region 18 and multiple metallic pads 20, wherein the metallic pads 20 have multiple metallic contacts 22 for the electric connection between the metallic pads 20 and the metallic traces 12; two spacer walls 26, 28, wherein the spacer wall 26 is formed on the light transparent substrate 10 and disposed corresponding to the position between the metallic pads 20 and the light-sensing region 18; the spacer wall 28 is formed on the light transparent substrate 10 and disposed between the metallic ball 14 and the metallic pad 20; and a glue layer 30, used to seal the gap between the light-sensing element 16 and the light transparent substrate 10. As shown in FIG. 3, the glue layer 30 is confined to between the spacer wall 26 and the spacer wall 28. Even if the heights of the spacer walls 26, 28 do not exceed the spacing between the light-sensing element 16 and the light transparent substrate 10, the glue overflow, which occurs in the conventional technology, will not occur in this embodiment because of the surface tension of the glue. Thus, the problem that the glue overflows onto the metallic balls 14 and the light-sensing region 18 can be effectively avoided herein.

Figure 4:
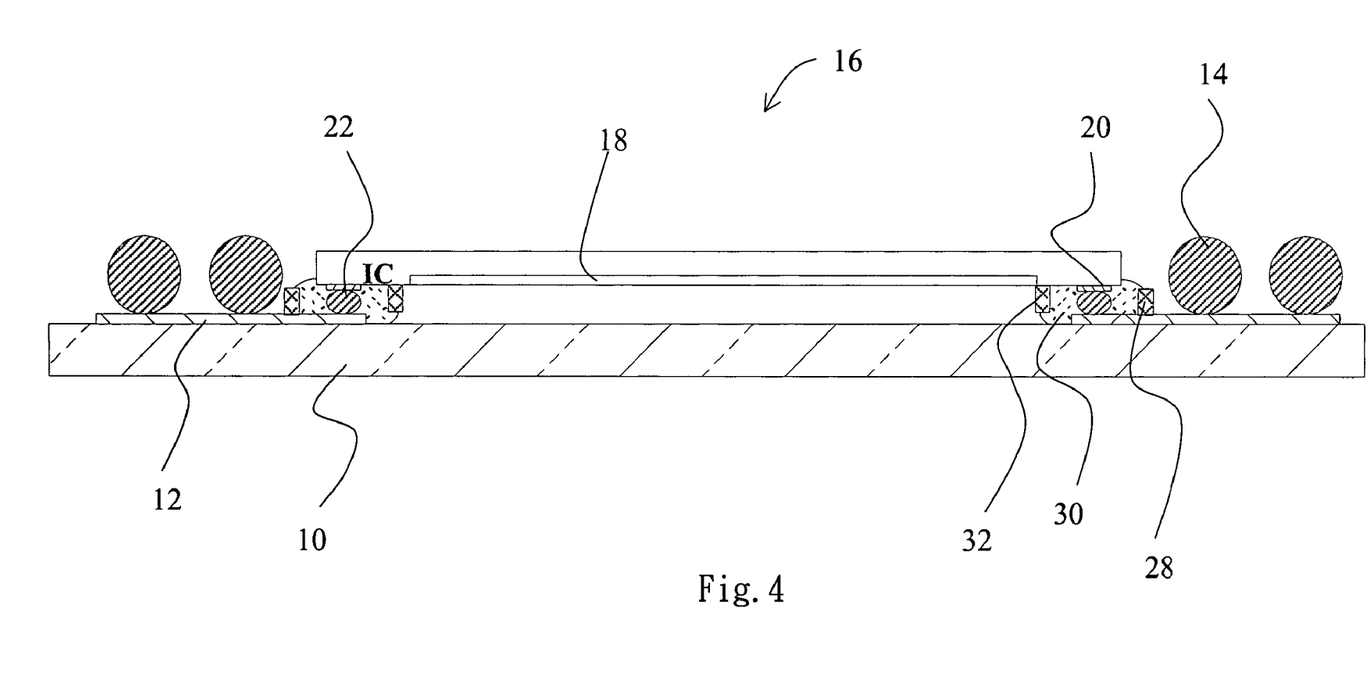
FIG. 4 is a diagram schematically showing further embodiment of the present invention.

Refer to FIG. 4 a diagram schematically showing further embodiment of the present invention. In this embodiment, the spacer wall 26 in the abovementioned embodiment, which is originally formed on the light transparent substrate 10 and disposed corresponding to the position between the metallic pads 20 and the light-sensing region 18, is otherwise formed on the lower surface of the light-element 16 and disposed between the metallic pads 20 and the light-sensing region 18, as shown by the spacer wall 32 in FIG. 4.

Figure 5:
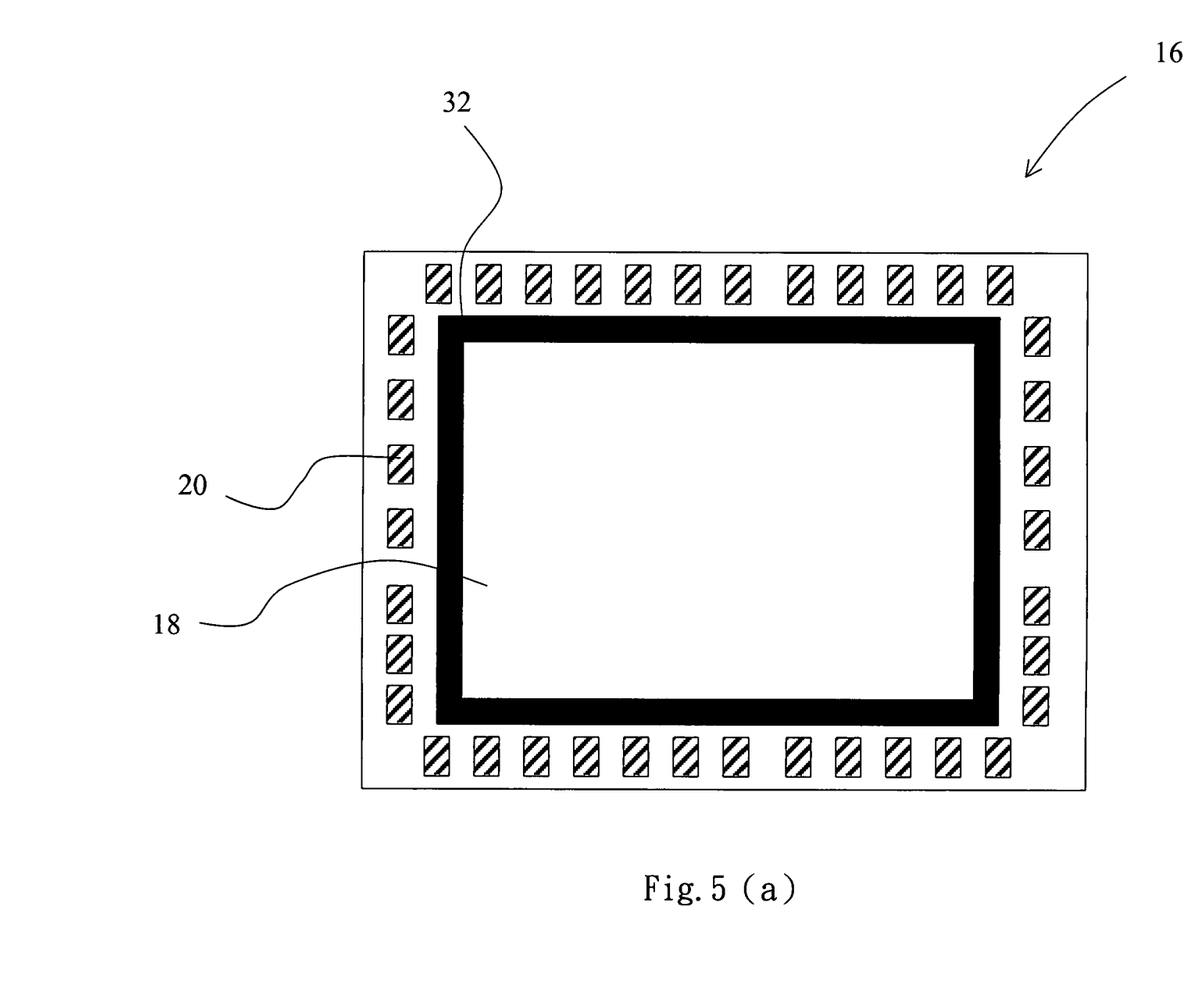
FIG. 5(a) to FIG. 5(c) are diagrams schematically showing the embodiments of the spacer walls according to the present invention.

As shown in the abovementioned embodiments, the spacer walls 26, 32 of the present invention are disposed between the metallic pads 20 and the light-sensing region 18. Thus, it is reasonable to design the forms of the spacer walls 26, 32 according to the distribution contour of the metallic pads 20, as those shown in from FIG. 5(a) to FIG. 5(c). In from FIG. 5(a) to FIG. 5(c), three common distribution contours of the metallic pads 20—a loop, two parallel lines, and a U-shape—and the forms of the spacer walls 26, 32 corresponding to those three distribution contours, which are also are a loop, two parallel lines, and a U-shape, are exemplified with the spacer wall 32, which is formed on the light-sensing element 16. However, according to the objective of effectively retarding external pollutants, the spacer wall of a loop shape, which encloses the light-sensing region completely, can also be applied to the cases wherein the distribution contours of the metallic pads are of a U-shape or two parallel lines.

In summary, the present invention is a packaging structure of a light-sensing device with a spacer wall, which utilizes a spacer wall to protect the light-sensing region and the metallic balls from the pollution of the external pollutants or against the influence of the overflow glue in order to guarantee the yield and performance of the product. Confronting the trend of fabricating slim and lightweight electronic elements, the present invention can also overcome the problem of overflow-glue pollution, which the miniaturization of electronic elements must face but the conventional technology cannot solve.

Those described above are only the preferred embodiments of the present invention and not intended to limit the scope of the present invention. Any equivalent modification and variation according to the characteristics, the structures or the spirit of the present invention disclosed herein is to be included within the scope of the present invention.

What is claimed is:

1. A packaging structure of a light-sensing device with a spacer wall, comprising:
    a light transparent substrate, having metallic traces on its surface;
    a light-sensing element, further comprising: a light-sensing region, multiple metallic pads, and multiple metallic contacts that are disposed on said metallic pads and used to form the electric connection between said metallic pads and said metallic traces; and
    a first spacer wall, disposed between said metallic pads and said light-sensing region of said light-sensing element and sandwiched between said light transparent substrate and said light-sensing element, said first spacer wall having a height equal to a distance between said light transparent substrate and said light-sensing element and forming a closed contour about said light-sensing region of said light-sensing element.

2. The packaging structure of a light-sensing device with a spacer wall according to claim 1, further comprising multiple metallic balls disposed on said metallic traces of said light transparent substrate.

3. The packaging structure of a light-sensing device with a spacer wall according to claim 1, wherein said first spacer wall is formed via a screen-printing method.

4. The packaging structure of a light-sensing device with a spacer wall according to claim 1, wherein said first spacer wall is made of a polyimide.

5. The packaging structure of a light-sensing device with a spacer wall according to claim 1, wherein a second spacer wall is formed in an appropriate position on one side of said metallic pads, which is far away from said light-sensing region.

6. The packaging structure of a light-sensing device with a spacer wall according to claim 2, wherein a second spacer wall is formed on said light transparent substrate and disposed between said metallic pads and said metallic balls.

7. The packaging structure of a light-sensing device with a spacer wall according to claim 6, wherein a glue layer is formed between said first spacer wall and said second spacer wall in order to seal the gap between said light-sensing element and said substrate.

8. The packaging structure of a light-sensing device with a spacer wall according to claim 1, wherein said light transparent substrate is made of a glass.

9. The packaging structure of a light-sensing device with a spacer wall according to claim 1, wherein said light transparent substrate can filter out a light of a specific light wavelength.

10. A packaging structure of a light-sensing device with a spacer wall, comprising:
   a light transparent substrate, having metallic traces on its surface;
   a light-sensing element, further comprising: a light-sensing region, multiple metallic pads, and multiple metallic contacts that are disposed on said metallic pads and used to form the electric connection between said metallic pads and said metallic traces;
   a first spacer wall, disposed corresponding to a position between the metallic pads and the light-sensing region and sandwiched between said light transparent substrate and said light-sensing element, said first spacer wall having a height greater than a distance between said light transparent substrate and said light-sensing element and forming a closed contour about said light-sensing region of said light-sensing element; and
   a glue layer, disposed between said light transparent substrate and said light-sensing element, and used to seal the gap between said light transparent substrate and said light-sensing element.

11. The packaging structure of a light-sensing device with a spacer wall according to claim 10, further comprising multiple metallic balls disposed on said metallic traces of said light transparent substrate.

12. The packaging structure of a light-sensing device with a spacer wall according to claim 11, further comprising a second spacer wall, which is formed on said light transparent substrate and disposed between said metallic pads and said metallic balls.

13. The packaging structure of a light-sensing device with a spacer wall according to claim 10, wherein a second spacer wall is formed in an appropriate position on one side of said metallic pads, which is far away from said light-sensing region.

14. The packaging structure of a light-sensing device with a spacer wall according to claim 10, wherein said first spacer wall is formed via a screen-printing method.

15. The packaging structure of a light-sensing device with a spacer wall according to claim 13, wherein said second spacer wall is formed via a screen-printing method.

16. The packaging structure of a light-sensing device with a spacer wall according to claim 10, wherein said light transparent substrate is made of a glass.

17. The packaging structure of a light-sensing device with a spacer wall according to claim 10, wherein said light transparent substrate can filter out a light of a specific light wavelength.

* * * * *